(12) United States Patent
Park

(10) Patent No.: US 7,504,334 B2
(45) Date of Patent: Mar. 17, 2009

(54) SEMICONDUCTOR DEVICE AND METHOD FOR MANUFACTURING SAME

(75) Inventor: Keun Soo Park, Gyeonggi-do (KR)

(73) Assignee: Dorigbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/609,887

(22) Filed: Dec. 12, 2006

(65) Prior Publication Data
US 2007/0148986 A1 Jun. 28, 2007

(30) Foreign Application Priority Data
Dec. 28, 2005 (KR) .................... 10-2005-0132008

(51) Int. Cl.
*H01L 21/4763* (2006.01)
(52) U.S. Cl. .................. 438/629; 438/639
(58) Field of Classification Search ........... 257/774; 438/629, 639, 640, 667, 668, 672, 675, 700, 438/701, 713
See application file for complete search history.

(56) References Cited

U.S. PATENT DOCUMENTS
6,835,648 B2 * 12/2004 Hong et al. .................. 438/622

* cited by examiner

*Primary Examiner*—Roy K Potter
(74) *Attorney, Agent, or Firm*—Sherr & Vaughn, PLLC

(57) ABSTRACT

Embodiments relate to a semiconductor device and a manufacturing method thereof. In embodiments, the semiconductor device may include a semiconductor substrate formed thereon with a first metal line, a PMD (pre metal dielectric) layer formed on the semiconductor substrate and having first and second contact holes, a first metal layer formed in the first contact hole; a second metal layer formed in the second contact hole, and a second metal line formed on the PMD layer and connected to the first and second metal layers, respectively.

15 Claims, 13 Drawing Sheets

SEMICONDUCTOR DEVICE AND METHOD FOR MANUFACTURING SAME

The present application claims priority under 35 U.S.C. 119 and 35 U.S.C. 365 to Korean Patent Application No. 10-2005-0132008 (filed on Dec. 28, 2005), which is hereby incorporated by reference in its entirety.

BACKGROUND

In semiconductor devices, a metal interconnection may be connected to an upper portion of a metal line formed on a semiconductor substrate, and may apply an electric signal to a semiconductor device. Such connection may be achieved through a contact hole.

In a multi-layered interconnection structure, metal interconnection layers and insulating layers may alternately be formed on the semiconductor substrate. Metal interconnection layers, which may be isolated from each other by the insulating layers, may be electrically connected to each other, for example through via holes so that circuits can be operated.

A related art method of forming a metal interconnection of a semiconductor device will be described with reference to accompanying drawings.

FIGS. 1A to 1F are example sectional diagrams illustrating a related art procedure for forming the metal interconnection of a semiconductor device.

Referring to FIG. 1A, first metal line 4 may be formed on semiconductor substrate 2 including a structure (not shown) formed through a known semiconductor manufacturing process. Pre-metal dielectric (PMD) layer 6 may be formed on a surface, for example the entire top surface, of semiconductor substrate 2 including first metal line 4. PMD layer 6 may be planarized, for example through a chemical mechanical polishing (CMP) process.

Referring to FIG. 1B, a photoresist film may be coated on PMD layer 6, and then subjected to an exposure and development process. Photoresist film pattern 8 that may expose a prescribed portion of PMD layer 6 may thereby be formed.

Referring to FIG. 1C, exposed PMD layer 6 may be dry-etched by, for example using photoresist film pattern 8 as a mask. Contact hole 10 may thereby be formed, which may expose a part of metal line 4. Photoresist layer pattern 8 may then be removed.

Referring to FIG. 1D, barrier metal layer 12 may be shallowly deposited on an entire surface of a PMD layer 6a including an inner wall of contact hole 10. Metal layer 14 may be formed on barrier metal layer 12 in such a manner that contact hole 10 may be filled with metal layer 14.

Referring to FIG. 1E, barrier metal layer 12 and metal layer 14 may be planarized through the CMP process until a surface of PMD layer 6a is exposed.

Referring to FIG. 1F, second metal line pattern 16 may be formed on PMD layer 6a, barrier metal layer 12a, and metal layer 14a. The metal interconnection of a semiconductor device may thereby be formed.

A related art semiconductor and related methods may have various problems. For example, when forming a metal interconnection of the semiconductor device according to the related art, since the metal interconnection of the semiconductor device may be formed according to a predetermined design, a number of metal interconnections may need to be increased to operate the semiconductor device under a high voltage level as may be required by a user. Such an increase of the metal interconnections may raise a failure rate of a semiconductor device.

In addition, since the metal interconnections of a related art semiconductor device may be formed according to a predetermined design, it may be difficult to manufacture semiconductor devices that may be required by each individual user.

SUMMARY

Embodiments relate to a semiconductor device and a method for manufacturing the same.

Embodiments relate to a semiconductor device and a method for manufacturing the same, in which a contact hole filled with an insulating material is provided in addition to a contact hole filled with a metal so that a high voltage required by a user can be applied to a metal interconnection.

According to embodiments, a semiconductor device may include a semiconductor substrate formed thereon with a first metal line, a PMD (pre metal dielectric) layer formed on the semiconductor substrate and having first and second contact holes, a first metal layer formed in the first contact hole, a second metal layer formed in the second contact hole, and a second metal line formed on the PMD layer and connected to the first and second metal layers, respectively.

According to embodiments, a method for manufacturing a semiconductor device may include forming a PMD (pre metal dielectric) layer on a semiconductor substrate including a first metal line, forming a first contact hole in the PMD layer, forming a first metal layer in the first contact hole, forming a second contact hole in the PMD layer, forming a second metal layer formed in the second contact hole, and forming a second metal line to be connected to the first and second metal layers, respectively, on the PMD layer.

DETAILED DESCRIPTION OF EMBODIMENTS

Figure 1A:
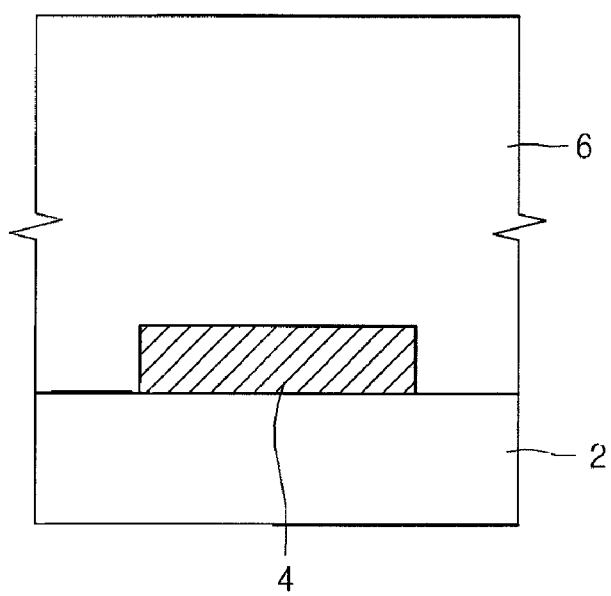
FIGS. 1A to 1F are example sectional diagrams illustrating a related art procedure for manufacturing a metal interconnection of a semiconductor device.
Figure 1B:
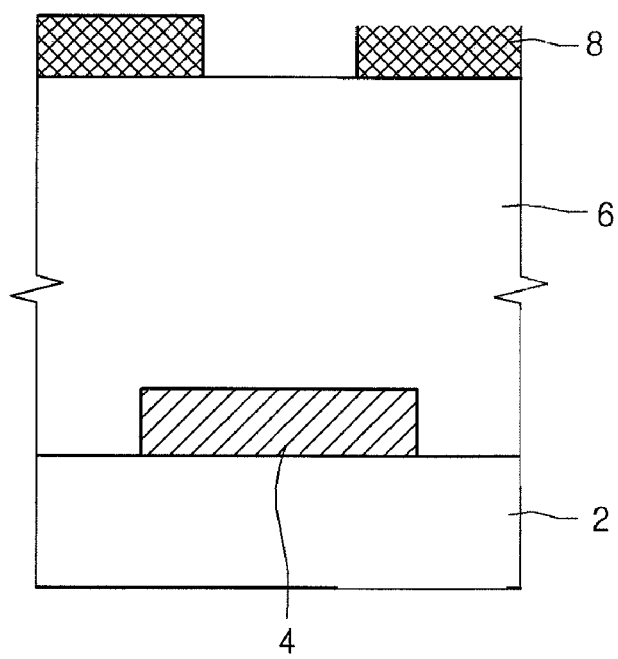
Figure 1C:
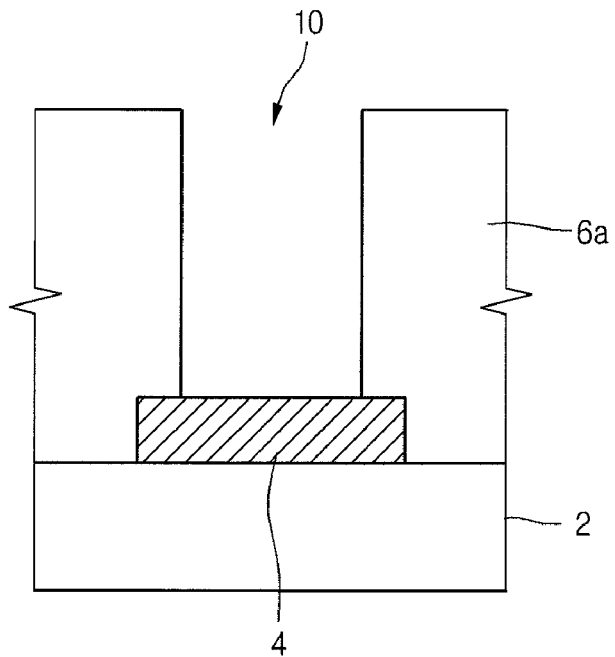
Figure 1D:
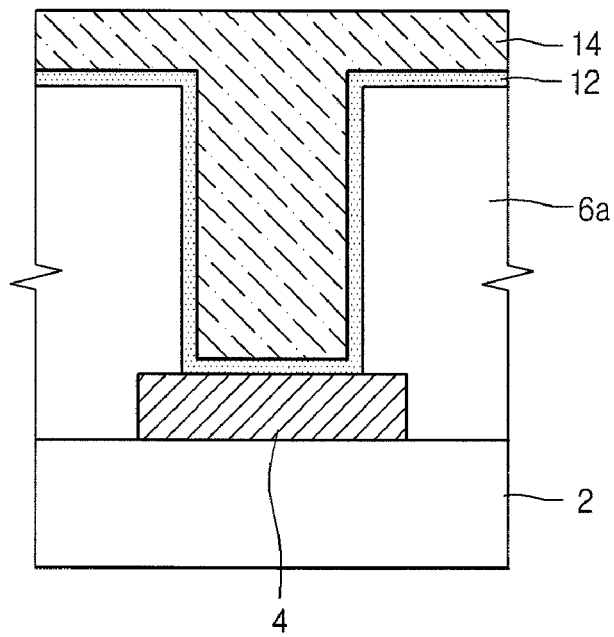
Figure 1E:
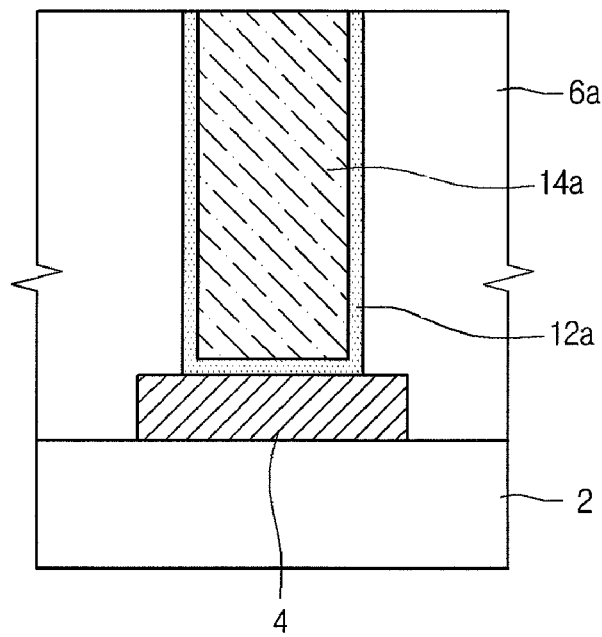
Figure 1F:
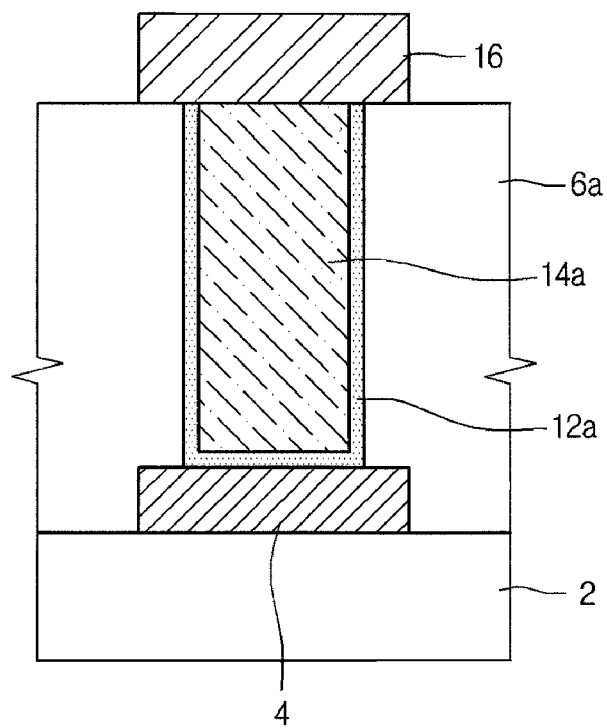
Figure 2A:
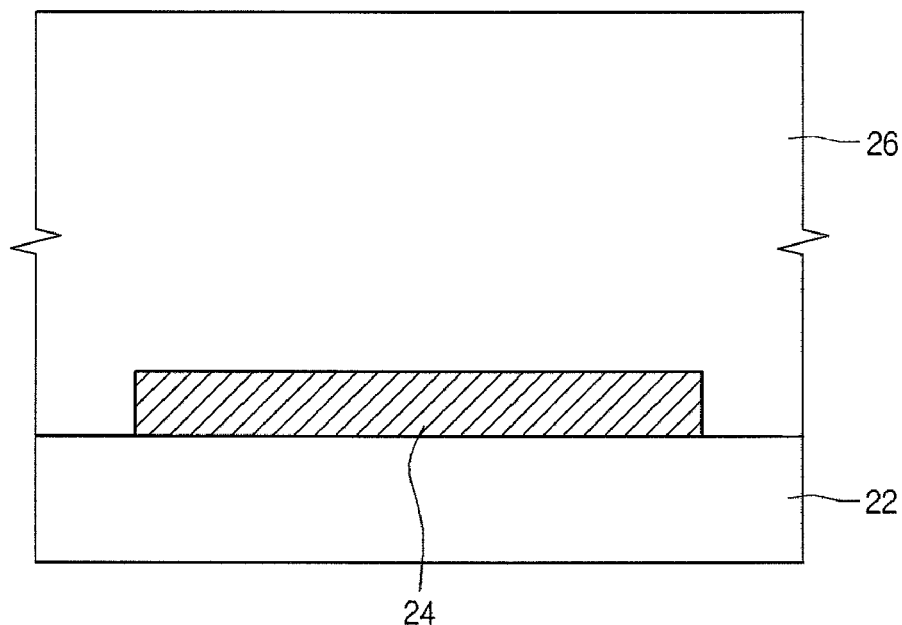
FIGS. 2A to 2K are example sectional diagrams illustrating a semiconductor device and a procedure for manufacturing a semiconductor device according to embodiments.

Referring to FIG. 2A, first metal line 24 may be formed on semiconductor substrate 22. PMD (Pre Metal Dielectric) layer 26 may be formed on a surface of semiconductor substrate 22 and first metal line 24. PMD layer 26 may be planarized, for example through a CMP (Chemical Mechanical Polishing) process.

Figure 2B:
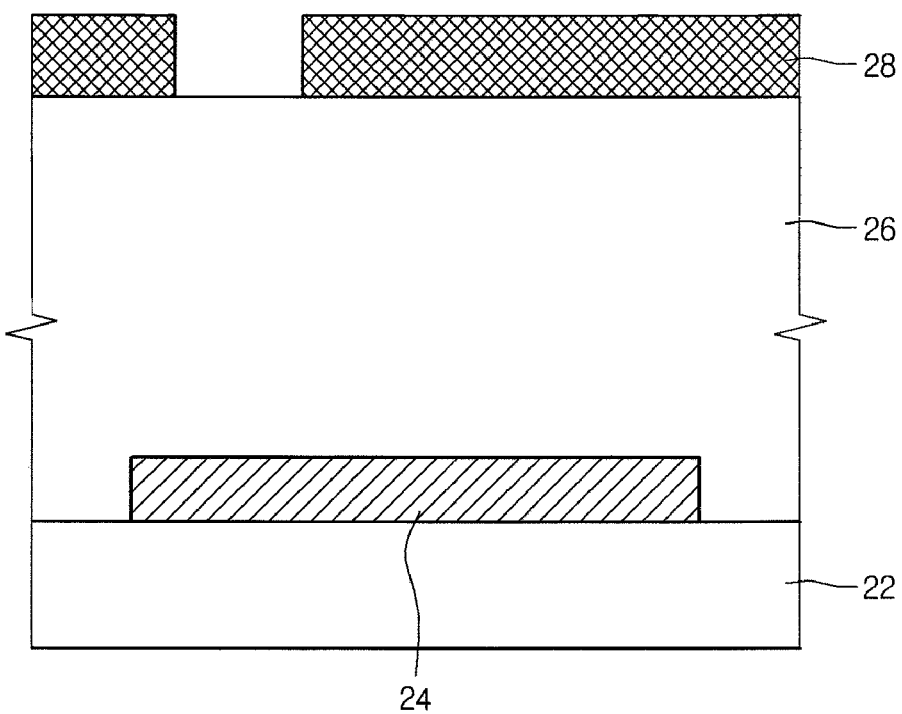

Referring to FIG. 2B, a photoresist film may be coated on PMD layer 26 and an exposure and development process may be performed with respect to the photoresist film. First photoresist film pattern 28 may thus be formed, and may expose a prescribed portion of PMD layer 26.

Figure 2C:
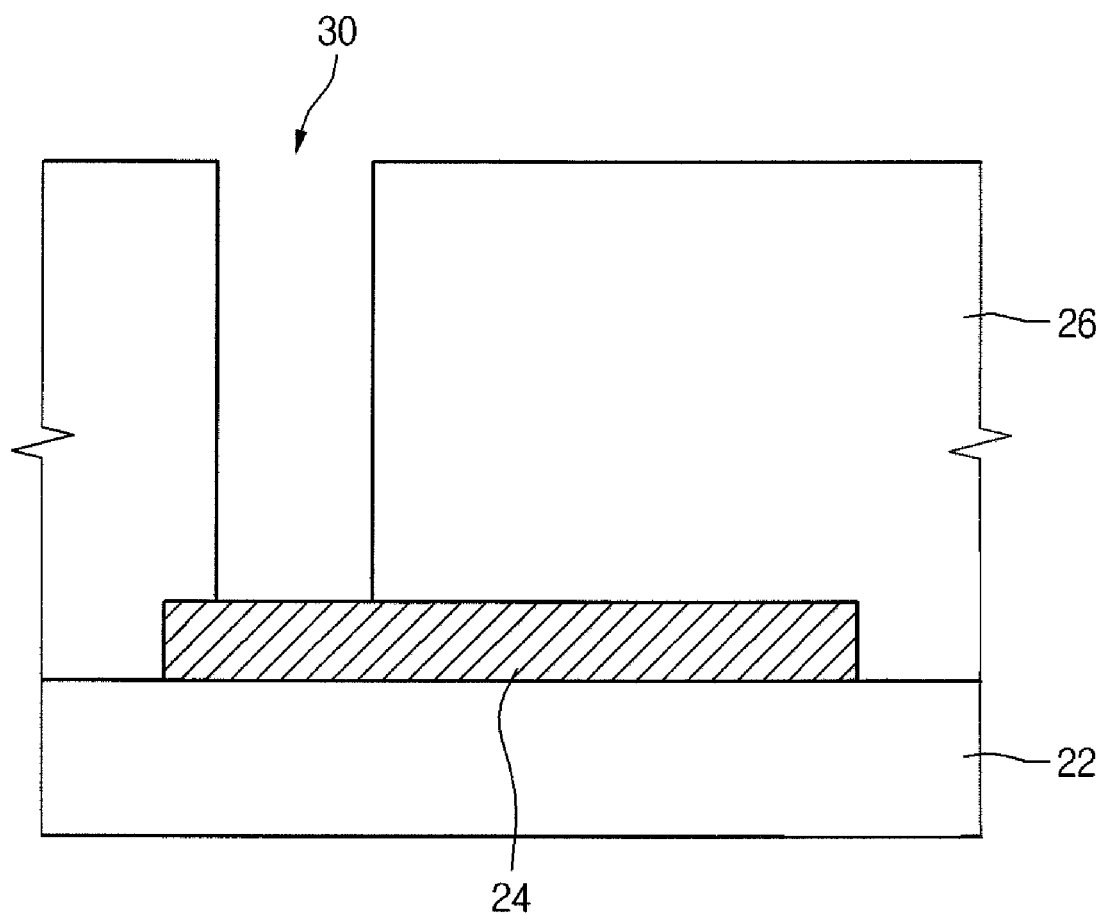

Referring to FIG. 2C, the exposed PMD layer 26 may be dry-etched, for example by using first photoresist film pattern 28 as an etch mask. First contact hole 30 made thus be formed, and may expose a part of metal line 24. First photoresist film pattern 28 may be removed.

Figure 2D:
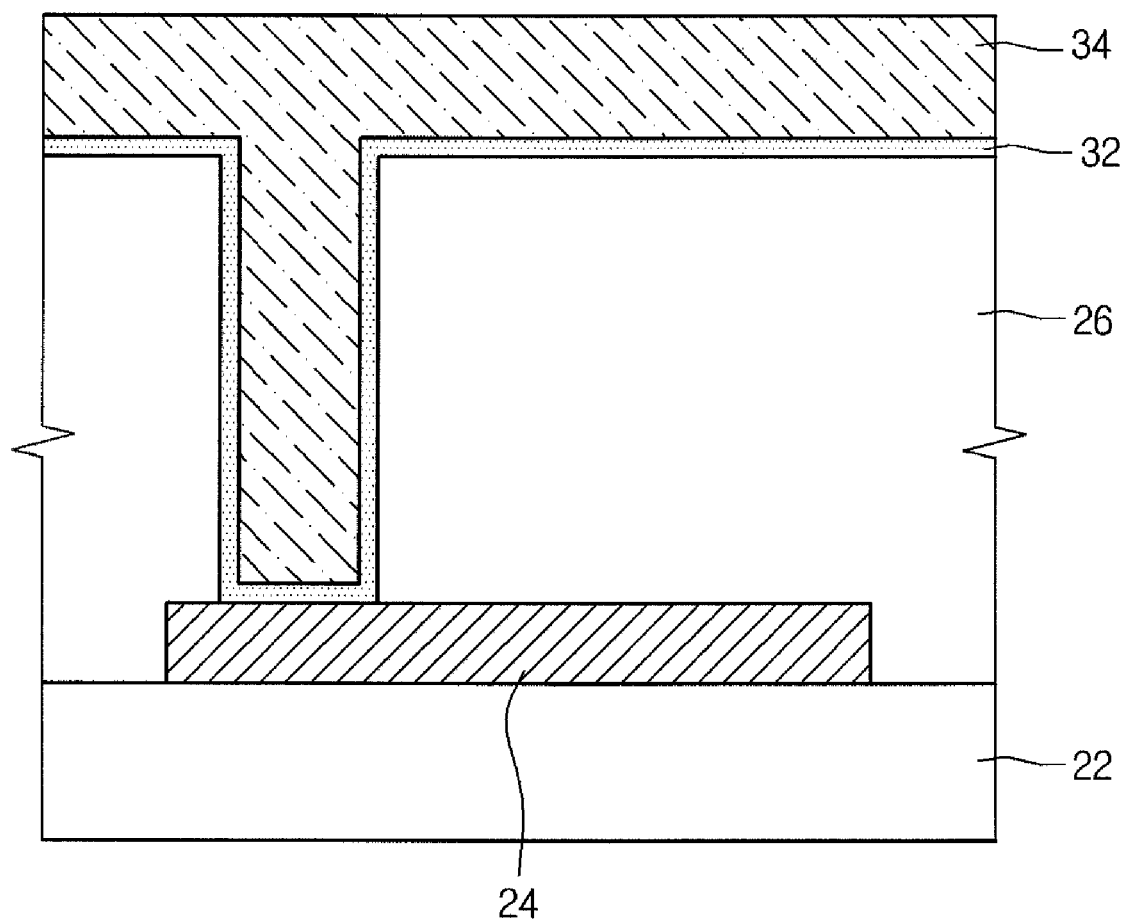

Referring to FIG. 2D, first barrier metal layer 32 may be shallowly deposited in first contact hole 30 and first metal layer 34 may be formed on first barrier metal layer 32. First contact hole 30 may thus be filled with first metal layer 34.

Figure 2E:
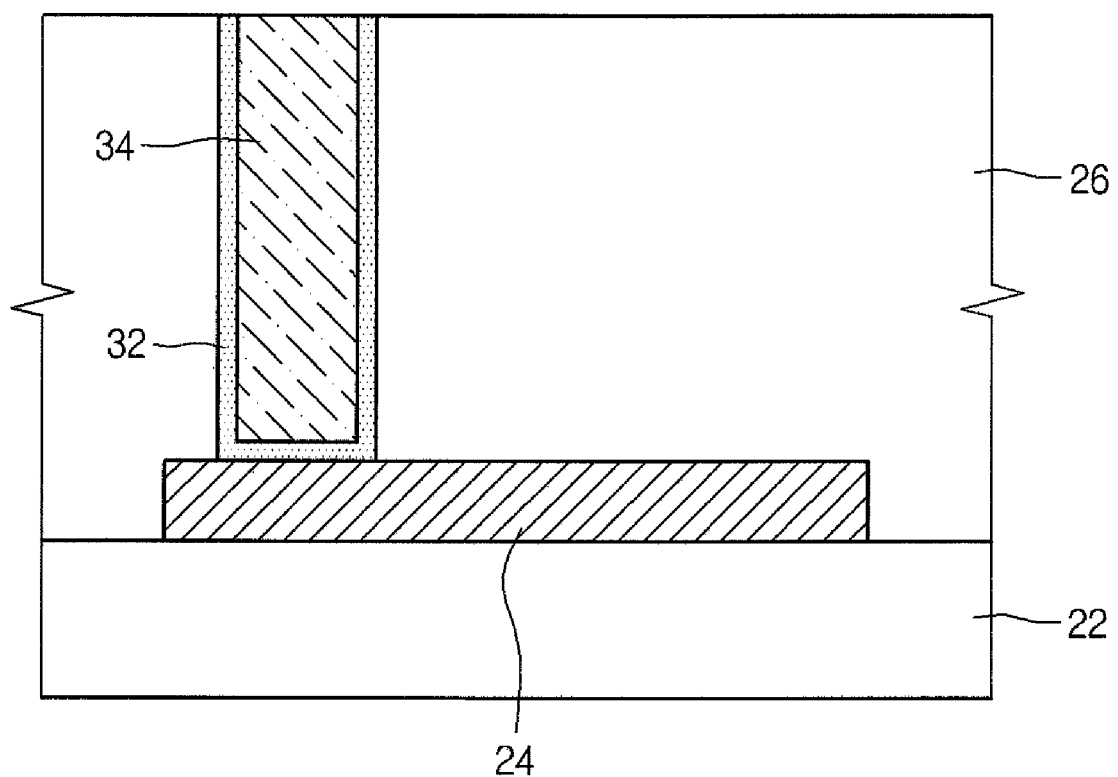

Referring to FIG. 2E, first barrier metal layer 32 and first metal layer 34 may be planarized, for example through a CMP process, and a surface of PMD layer 26 may be exposed.

In embodiments, the first barrier metal layer may be formed by using a metal, such as titanium, and the first metal layer may include tungsten.

Figure 2F:
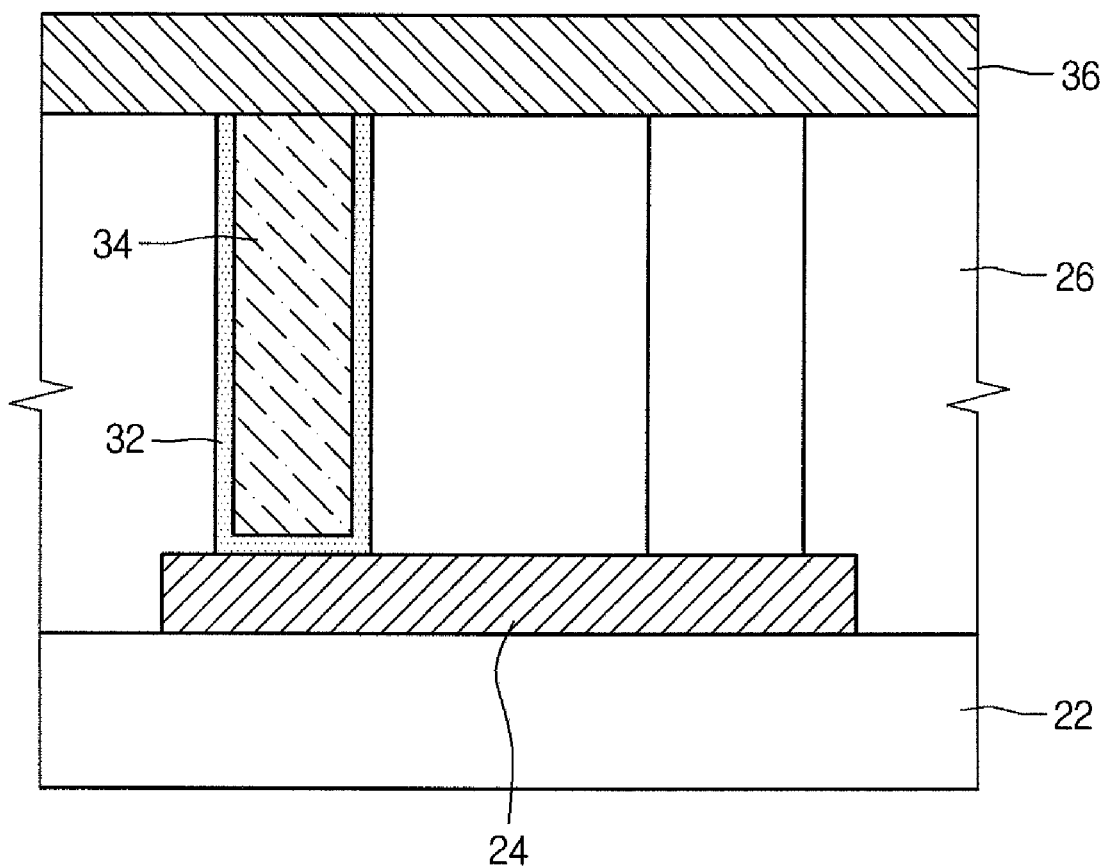

Referring to FIG. 2F, interlayer dielectric layer 36, which may include a nitride layer, may be formed on PMD layer 26, first barrier metal layer 32 and first metal layer 34.

Figure 2G:
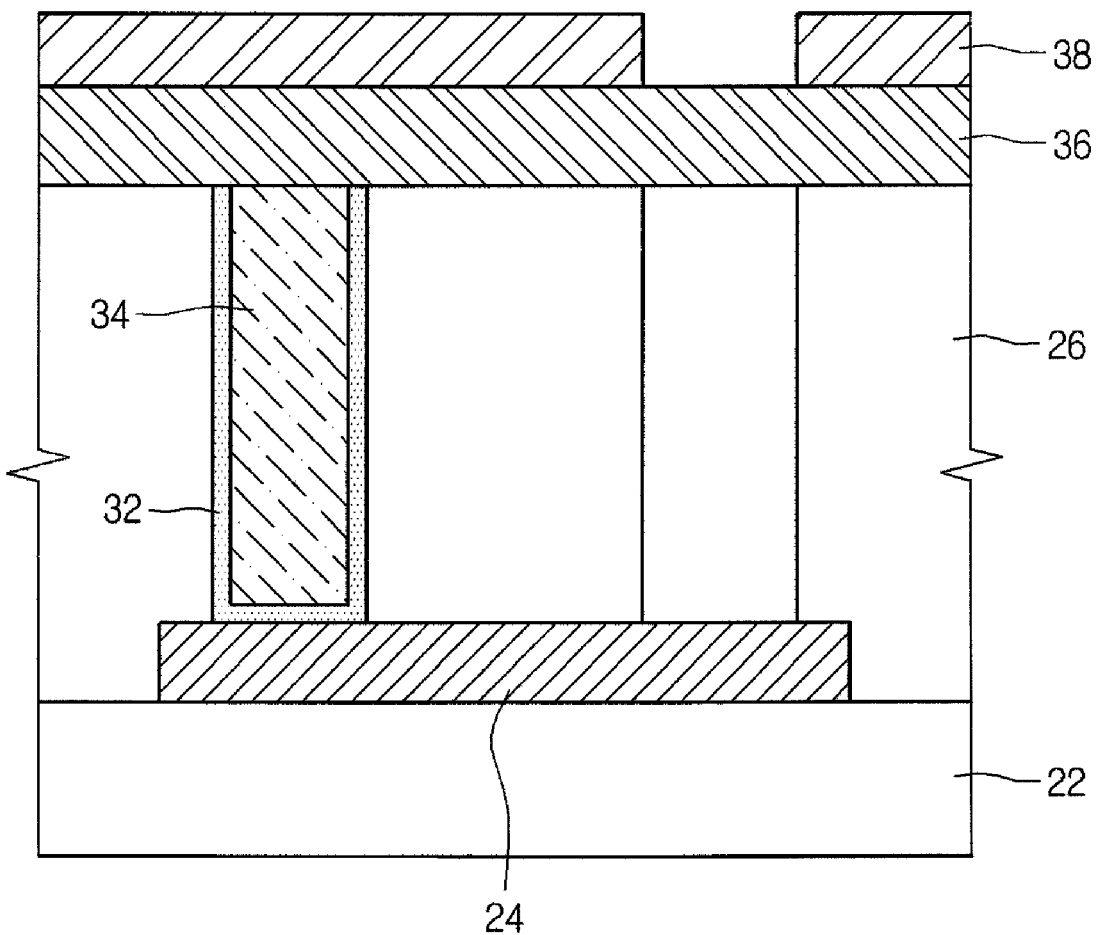

Referring to FIG. 2G, second photoresist film pattern 38 may be formed on interlayer dielectric layer 36 to expose a prescribed portion of interlayer dielectric layer 36.

Figure 2H:
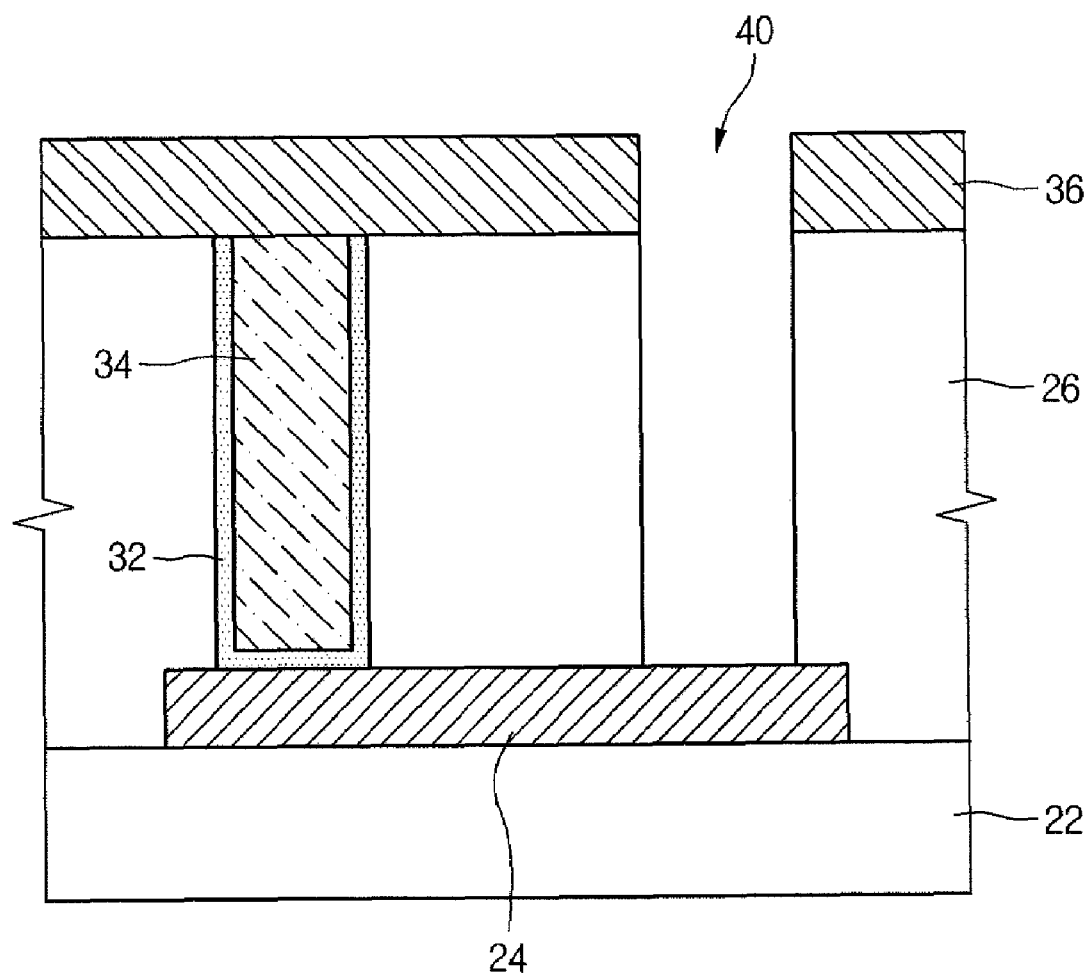

Referring to FIG. 2H, prescribed portions of insulating layer 36 and PMD layer 26a may be dry-etched, thereby forming second contact hole 40, which may expose a prescribed portion of first metal line 24.

Second photoresist film pattern 38 may be removed. According to embodiments, two (2) contact holes 30 and 40 may be formed in first metal line 24.

Figure 2I:
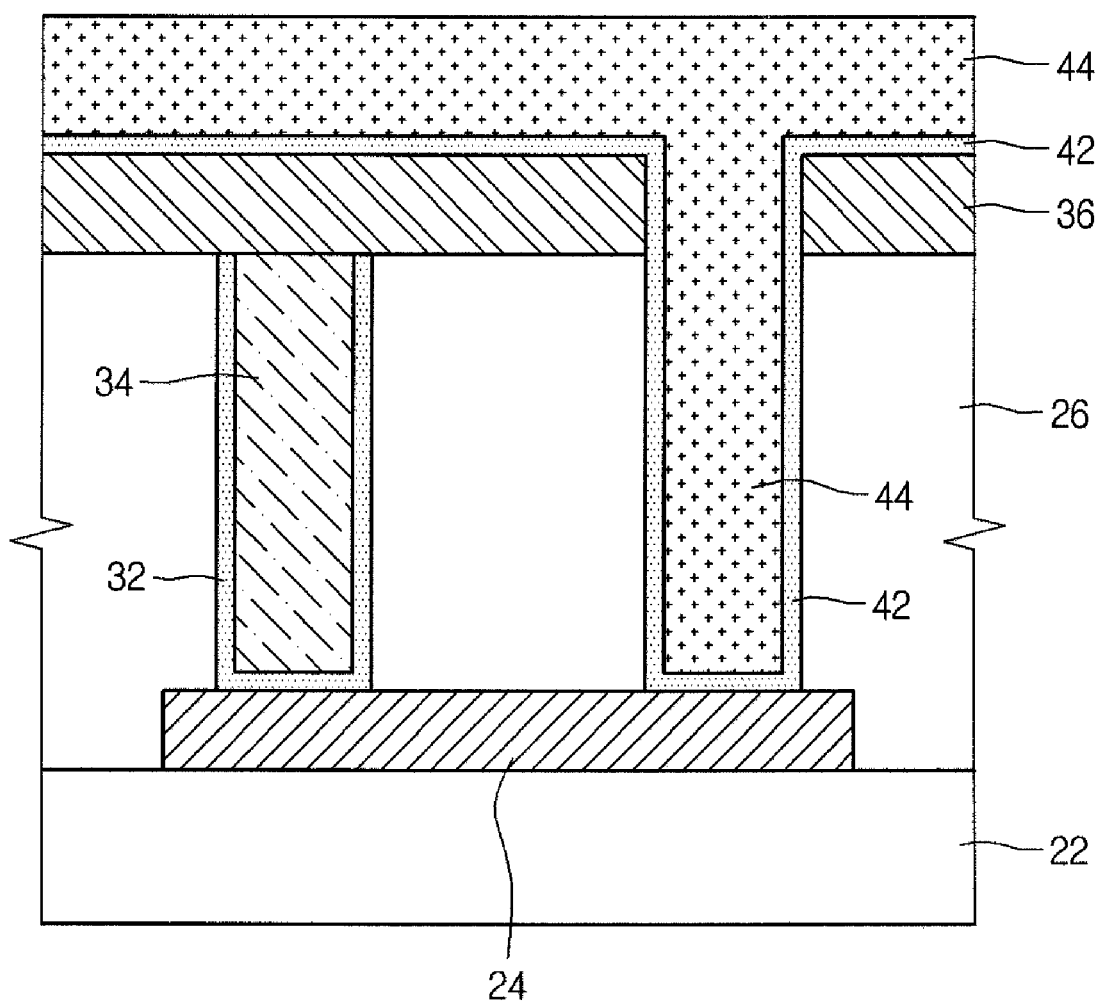

Referring to FIG. 2I, second barrier metal layer 42 may be shallowly deposited in second contact hole 40 and on interlayer dielectric layer 36. Silicon layer 44 may be formed on second barrier metal layer 42. Second contact hole 40 may thus be filled with silicon layer 44.

Figure 2J:
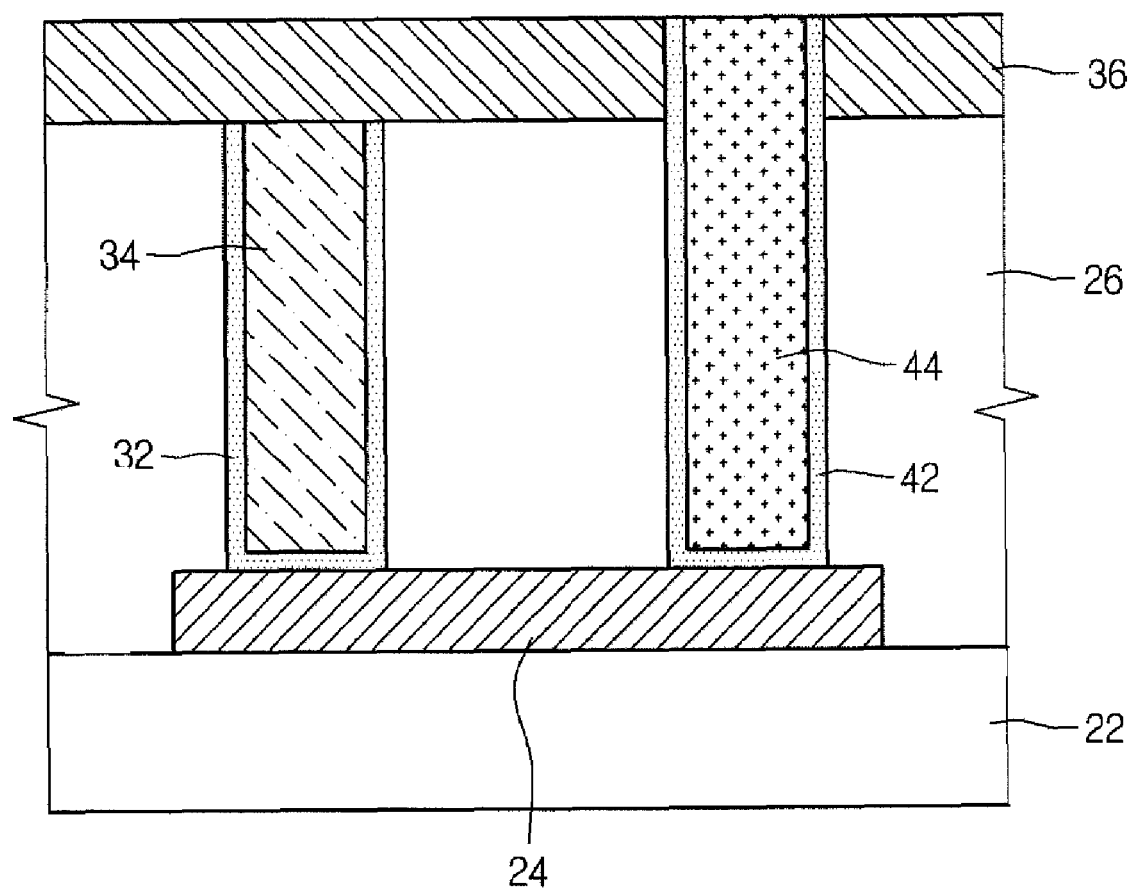

Referring to FIG. 2J, second barrier metal layer 42 and silicon layer 44 may be planarized, for example through a CMP process, and a surface of interlayer dielectric layer 36 may be exposed.

According to embodiments, second barrier metal 42 may include titanium, and silicon layer 44 may include amorphous silicon.

Figure 2K:
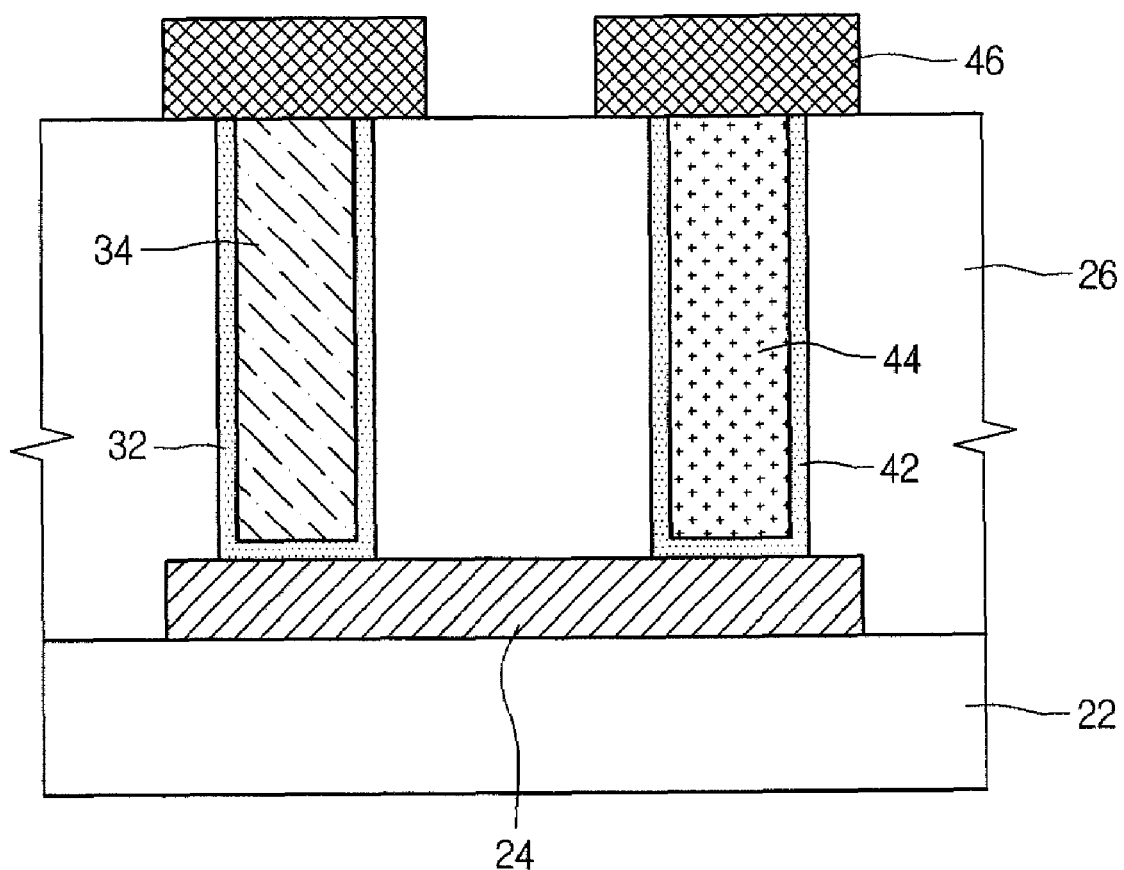

Referring to FIG. 2K, interlayer dielectric layer 36 may be removed from PMD layer 26. Second metal line 46, which may include a first metal connected to first metal layer 34 and a second metal connected to second metal layer 44, may be formed.

In embodiments, second metal line 46 may include a first metal pattern to be electrically connected to first metal layer 34 and a second metal pattern that may be electrically connected to second metal layer 44.

In embodiments, second contact hole 40 may be formed by etching the insulating layer 36 and PMD layer 26 after forming insulating layer 36 on PMD layer 26 and second photoresist film pattern 38 on the insulating layer 36. In embodiments, second contact hole 40 may be formed by etching PMD layer 26 after directly forming the photoresist film pattern 38 on PMD layer 26.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
    forming a pre-metal dielectric (PMD) layer over a first metal line on a semiconductor substrate;
    forming a first metal layer in the PMD layer;
    forming a second metal layer in the PMD layer; and then
    forming a second metal line electrically connected to the first and second metal layers, respectively, over the PMD layer, wherein the first and second metal layers are located at prescribed positions and configured to be electrically connected to the first metal line.

2. The method of claim 1, further comprising:
    forming a first contact hole in the PMD layer;
    forming the first metal layer in the first contact hole;
    forming a second contact hole in the PMD layer; and
    forming the second metal layer in the second contact hole.

3. The method of claim 2, further comprising forming a first barrier metal layer in the first contact hole before the first metal layer is formed.

4. The method of claim 3, wherein the first and second barrier metal layers comprises titanium.

5. The method of claim 2, further comprising forming a second barrier metal layer in the second contact hole before the second metal layer is formed.

6. The method of claim 5, wherein the first and second barrier metal layers comprises titanium.

7. The method of claim 2, further comprising forming a nitride layer on the PMD layer before the second contact hole is formed, wherein the second contact hole is formed by simultaneously etching the PMD layer and the nitride layer.

8. The method of claim 1, wherein the second metal layer comprises amorphous silicon.

9. The method of claim 1, wherein the second metal line comprises a first pattern electrically connected to the first metal layer and a second pattern electrically connected to the second metal layer.

10. A method comprising:
    forming a pre-metal dielectric layer over a first metal line on a semiconductor substrate;
    forming a metal layer in the pre-metal dielectric layer;
    forming a silicon layer in the pre-metal dielectric layer; and then
    forming a second metal line electrically connected to the metal layer and the silicon layer, respectively, over the pre-metal dielectric layer, the second metal line including a first pattern electrically connected to the metal layer and a second pattern electrically connected to the silicon layer.

11. The method of claim 10, wherein forming the metal layer comprises:
    forming a first contact hole in the pre-metal dielectric layer exposing a portion of the first metal line;
    forming a first metal barrier layer in the first contact hole;
    forming the metal layer in the first contact hole and over the first metal barrier layer; and then
    planarizing the first metal barrier layer and the metal layer exposing the surface of the pre-metal dielectric layer.

12. The method of claim 11, wherein forming the silicon layer comprises:
    forming an interlayer dielectric layer over the pre-metal dielectric layer including the first barrier metal layer and the metal layer;
    forming a second contact hole in the interlayer dielectric layer and the pre-metal dielectric layer exposing a portion of the first metal line;
    forming a second metal barrier layer in the first contact hole;
    forming the silicon layer in the first contact hole and over the second metal barrier layer; and then
    planarizing the second metal barrier layer and the silicon layer exposing the surface of the interlayer dielectric layer.

13. The method of claim 12, wherein the first and second barrier metal layers comprises titanium.

14. The method of claim 12, wherein the silicon layer comprises amorphous silicon.

15. A method comprising:
    forming a pre-metal dielectric layer over a first metal line on a semiconductor substrate;
    forming a first metal layer at prescribed position in the pre-metal dielectric layer and electrically connected to the first metal line;
    forming a second metal layer at a prescribed position in the pre-metal dielectric layer and electrically connected to the first metal line; and then
    forming a second metal line electrically connected to the first and second metal layers, respectively, over the pre-metal dielectric layer, the second metal line including a first pattern electrically connected to the first metal layer and a second pattern electrically connected to the second metal layer.

* * * * *